United States Patent
Xu et al.

(10) Patent No.: US 10,162,015 B2
(45) Date of Patent: *Dec. 25, 2018

(54) SYSTEMS AND METHODS FOR DETERMINING A FAULT LOCATION IN A THREE-PHASE SERIES-COMPENSATED POWER TRANSMISSION LINE

(71) Applicant: General Electric Company, Schenectady, NY (US)

(72) Inventors: Zhihan Xu, Markham (CA); Tirath Bains, Schenectady, NY (US); Tarlochan Sidhu, Ajax (CA); Mohammad Reza Dadash Zadeh, Irvine, CA (US)

(73) Assignee: General Electric Company, Schenectady, NY (US)

( * ) Notice: Subject to any disclaimer, the term of this patent is extended or adjusted under 35 U.S.C. 154(b) by 65 days.

This patent is subject to a terminal disclaimer.

(21) Appl. No.: 15/083,818

(22) Filed: Mar. 29, 2016

(65) Prior Publication Data

US 2017/0227611 A1    Aug. 10, 2017

Related U.S. Application Data

(63) Continuation-in-part of application No. 15/018,470, filed on Feb. 8, 2016, now abandoned.

(51) Int. Cl.
  *G01R 31/14* (2006.01)
  *G01R 31/40* (2014.01)
  (Continued)

(52) U.S. Cl.
  CPC .......... *G01R 31/40* (2013.01); *G01R 31/025* (2013.01); *G01R 31/088* (2013.01)

(58) Field of Classification Search
  CPC .............. G01R 31/025; G01R 31/086; G01R 19/2513; G01R 31/024; G01R 31/083;
  (Continued)

(56) References Cited

U.S. PATENT DOCUMENTS 4,559,491 A * 12/1985 Saha ................... G01R 31/088
                                                                  324/522
6,529,010 B1 * 3/2003 Saha ................... G01R 31/085
                                                                  324/521
(Continued)

OTHER PUBLICATIONS

Eugeniusz Rosolowski, et al. "Fault Location Algorithm for Use with Current Differential Protective Relays of Double-Circuit Line." IEEE Transactions on Power Delivery, vol. 26, No. 4. Oct. 2011, pp. 2072-2080.

(Continued)

*Primary Examiner* — Vinh Nguyen
(74) *Attorney, Agent, or Firm* — Eversheds-Sutherland (US) LLP (57) ABSTRACT

Embodiments of the disclosure relate to systems and methods for determining a fault location in a three-phase series-compensated power transmission line system by using symmetrical components-based formulas that describe various voltage and current relationships. The voltage and current relationships can be derived using a synchronous measurement procedure that is concurrently executed at a sending end and a receiving end of the first series-compensated power transmission line system. Furthermore, determining the fault location in accordance with certain embodiments of the disclosure can eliminate one or more of a need to calculate an impedance value of any of the series capacitors or the series capacitor protection elements that are a part of the three-phase series-compensated power transmission line system, a need to monitor any of the series capacitor protection elements, and a need to measure a voltage drop across any of the series capacitors.

20 Claims, 4 Drawing Sheets

(51) Int. Cl.
*G01R 31/02* (2006.01)
*G01R 31/08* (2006.01)

(58) Field of Classification Search
CPC ...... G01R 31/085; G01R 25/00; G01R 27/18; G01R 31/02; G01R 31/08; G01R 31/1272; G01R 15/142; G01R 31/11; G01R 31/362; G01R 31/3624; G06F 1/26; G01V 3/06; H04B 1/707; H04B 2201/709709; H04L 1/242; H04L 25/085
See application file for complete search history.

(56) References Cited

U.S. PATENT DOCUMENTS

| | | | |
|---|---|---|---|
| 7,298,149 B2 * | 11/2007 | Saha | G01R 31/085 324/512 |
| 8,731,853 B2 * | 5/2014 | Balcerek | G01R 31/088 324/512 |
| 2011/0178741 A1 | 7/2011 | Saha | |
| 2017/0227595 A1 | 8/2017 | Xu et al. | |

OTHER PUBLICATIONS

Chi-Shan Yu, et al. "A New PMU-Based Fault Location Algorithm for Series Compensated Lines." IEEE Transactions on Power Delivery, vol. 17, No. 1, Jan. 2002, pp. 33-46.

Chi-Shan Yu, et al. "A New Fault Location Algorithm for Series Compensated Lines Using Synchronized Phasor Measurements." IEEE Power Engineering Society Summer Meeting 2000, vol. 3, pp. 1350-1354.

D.J. Spoor, et al. "Improved Single Ended Traveling Wave Fault Location Algorithm Based on Experience with conventional Substation Transducers." IEEE Transactions on Power Delivery, vol. 21, No. 3, Jul. 2006, pp. 1-7.

M.M. Saha, et al. "A New Accurate Fault Locating Algorithm for Series Compensated Lines." IEEE Transactions on Power Delivery, vol. 14, No. 3, Jul. 1999, pp. 789-797.

M.M. Saha, et al. "Fault Location in Uncompensated and Series-Compensated Parallel Lines" IEEE Power Engineering Society Winter Meeting, Singapore, vol. 4, Jan. 23-27, 2000, pp. 2431-2436.

Tirath Pal S. Bains, et al. "Challenges and Recommendations for Fault Location in Series Compensated Transmission Lines." IEEE PES General Meeting, National Harbor, MD, Jul. 2014, pp. 1-5.

Bains, T. P. S., and Zadeh, M. R. D., "Supplementary impedance-based fault-location algorithm for series-compensated lines," IEEE Transactions on Power Delivery, vol. 31, Issue 1, pp. 334-342 (Feb. 2016).

Fecteau, C., "Accurate fault location algorithm for series compensated lines using two-terminal unsynchronized measurements and hydro-quebec's field experience," 33rd Annual Western Protective Relay Conference, pp. 1-16 (Oct. 17-19, 2006).

Fulczyk, M., et al., "Two-end unsynchronized fault location algorithm for double-circuit series compensated lines," IEEE Power and Energy Society General Meeting—Conversion and Delivery of Electrical Energy in the 21st Century, pp. 1-9 (Jul. 20-24, 2008).

International Search Report and Written Opinion issued in connection with corresponding PCT Application No. PCT/US2017/016915 dated May 11, 2017.

* cited by examiner

SYSTEMS AND METHODS FOR DETERMINING A FAULT LOCATION IN A THREE-PHASE SERIES-COMPENSATED POWER TRANSMISSION LINE

CROSS-REFERENCE TO RELATED APPLICATION

This patent application is a continuation-in-part of U.S. patent application Ser. No. 15/018,470, titled "Systems and Methods for Determining a Fault Location in a Three-Phase Series-Compensated Power Transmission Line," filed Feb. 8, 2016, the entirety of which application is hereby incorporated herein by reference.

FIELD OF THE DISCLOSURE

This disclosure relates to series-compensated power transmission lines, and more particularly, to systems and methods for determining a fault location in a three-phase series-compensated power transmission line.

BACKGROUND OF THE DISCLOSURE

A series-compensated power transmission line typically incorporates a capacitor that is coupled in series with the power transmission line to compensate for the distributed series inductance presented by the power transmission line. The capacitive compensation is directed at optimizing power transmission capacity over the power transmission line. Also typically, a protection element such as a metal-oxide varistor (MOV) is coupled in parallel with the capacitor in order to prevent damage to the capacitor when a fault, such as a short-circuit for example, occurs on the power transmission line.

Unfortunately, the overall line impedance of the series-compensated power transmission line changes in a non-linear manner when the MOV transitions from a non-conducting state to a conducting state upon the occurrence of a fault. Additionally, the overall line impedance can vary in a somewhat unpredictable manner due to various factors such as the nature of the fault (short circuit, open circuit, bridged short across lines etc.), the severity of the fault, and the conduction characteristics of the MOV. Consequently, the use of a conventional fault locating system, which may be quite effective on a non-compensated power transmission line having a substantially consistent impedance characteristic, may turn out to be inadequate for identifying a fault location in a series-compensated power transmission line.

One traditional approach for addressing this issue involves the use of a different type of fault locating system that incorporates a deterministic procedure and takes into consideration the characteristics of the protection element (the MOV, for example) and various parameters associated with the faulty power transmission line. Such a procedure can include for example, various steps such as modeling the series compensated power transmission line, modeling the compensating capacitor, modeling the MOV, and monitoring the operational status of the MOV. Another traditional approach involves making an assumption of a faulty segment in a multi-segment power transmission system and executing a fault location procedure based on the assumption. Once a faulty segment is accurately identified, the exact location of the fault on this faulty segment has to be identified. Understandably, such traditional approaches can not only be complex and ambiguous but may also lead to imprecise results as a result of the assumptions being made.

BRIEF DESCRIPTION OF THE DISCLOSURE

Embodiments of the disclosure are directed generally to systems and methods for determining a fault location in a series-compensated power transmission line. In certain embodiments, a fault location in a three-phase series-compensated power transmission line system can be determined by using symmetrical components-based formulas to describe various voltage and current relationships present in the three-phase series-compensated power transmission line during a fault condition.

According to one exemplary embodiment of the disclosure, a three-phase series-compensated power line system includes a first series-compensated power transmission line, a second series-compensated power transmission line, a third series-compensated power transmission line, and a line fault location detector. The first series-compensated power transmission line is configured to propagate electrical power having a first phase, and includes a first compensating capacitor system that includes a first series capacitor and a first series capacitor protection element. The second series-compensated power transmission line is configured to propagate electrical power having a second phase, and includes a second compensating capacitor system that includes a second series capacitor and a second series capacitor protection element. The third series-compensated power transmission line is configured to propagate electrical power having a third phase, and includes a third compensating capacitor system that includes a third series capacitor and a third series capacitor protection element. The line fault location detector includes at least one processor that is configured to execute a first fault location procedure for identifying a location of a single-phase-to-ground fault in the three-phase series-compensated power line system. The first fault location procedure includes determining a zero sequence voltage drop based in part on a relationship between a first impedance presented by the first compensating capacitor system during the single-phase-to-ground fault, a second impedance presented by the second compensating capacitor system during the single-phase-to-ground fault, and a third impedance presented by the third compensating capacitor system during the single-phase-to-ground fault, wherein one of the first impedance, the second impedance, or the third impedance is an undetermined impedance that is attributable to a corresponding one of the first series capacitor protection element, the second series capacitor protection element, or the third series capacitor protection element turning active during the single-phase-to-ground fault. The first fault location procedure also includes determining at least one of a positive sequence voltage drop or a negative sequence voltage drop based in part on the relationship between the first impedance, the second impedance, and the third impedance; and determining the location of the single-phase-to-ground fault at least in part, by using the zero sequence voltage drop and the at least one of the positive sequence voltage drop or the negative sequence voltage drop to eliminate determining of the undetermined impedance.

According to another exemplary embodiment of the disclosure, a line fault detector includes a plurality of input interfaces configured to receive a set of electrical current measurements and a set of voltage measurements that are obtained via a synchronous measurement procedure concurrently executed at a sending end and a receiving end of the three-phase series-compensated power transmission line system. The line fault detector further includes at least one processor configured to execute a first fault location procedure for identifying a location of a single-phase-to-ground fault in the three-phase series-compensated power line system. The first fault location procedure includes determining a zero sequence voltage drop based in part on a relationship between a first impedance presented by the first compensating capacitor system during the single-phase-to-ground fault, a second impedance presented by the second compensating capacitor system during the single-phase-to-ground fault, and a third impedance presented by the third compensating capacitor system during the single-phase-to-ground fault, wherein one of the first impedance, the second impedance, or the third impedance is an undetermined impedance that is attributable to a corresponding one of the first series capacitor protection element, the second series capacitor protection element, or the third series capacitor protection element turning active during the single-phase-to-ground fault. The first fault location procedure also includes determining at least one of a positive sequence voltage drop or a negative sequence voltage drop based in part on the relationship between the first impedance, the second impedance, and the third impedance; and determining the location of the single-phase-to-ground fault at least in part, by using the zero sequence voltage drop and the at least one of the positive sequence voltage drop or the negative sequence voltage drop to eliminate determining of the undetermined impedance.

According to yet another exemplary embodiment of the disclosure, a method includes executing a synchronous measurement procedure concurrently at a sending end and a receiving end of a three-phase series-compensated power transmission line system for obtaining a set of electrical current measurements and a set of voltage measurements; receiving in a line fault location detector, the set of electrical current measurements and the set of voltage measurements based on the synchronous measurement procedure; and using at least one processor in the line fault location detector to execute a first fault location procedure for identifying a location of a single-phase-to-ground fault in the three-phase series-compensated power line system. The first fault location procedure includes determining a zero sequence voltage drop based in part on a relationship between a first impedance presented by the first compensating capacitor system during the single-phase-to-ground fault, a second impedance presented by the second compensating capacitor system during the single-phase-to-ground fault, and a third impedance presented by the third compensating capacitor system during the single-phase-to-ground fault, wherein one of the first impedance, the second impedance, or the third impedance is an undetermined impedance that is attributable to a corresponding one of the first series capacitor protection element, the second series capacitor protection element, or the third series capacitor protection element turning active during the single-phase-to-ground fault; determining at least one of a positive sequence voltage drop or a negative sequence voltage drop based in part on the relationship between the first impedance, the second impedance, and the third impedance; and determining the location of the single-phase-to-ground fault at least in part, by using the zero sequence voltage drop and the at least one of the positive sequence voltage drop or the negative sequence voltage drop to eliminate determining of the undetermined impedance.

Other embodiments and aspects of the disclosure will become apparent from the following description taken in conjunction with the following drawings.

BRIEF DESCRIPTION OF THE DRAWINGS

Having thus described the disclosure in general terms, reference will now be made to the accompanying drawings, which are not necessarily drawn to scale, and wherein:

DETAILED DESCRIPTION OF THE DISCLOSURE

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. For example, it should be understood that the phrase "transmission line" as used herein generally refers to an electrical conductor that conducts electrical power between two points, generally referred to herein as a "sending end" and a "receiving end" of a power transmission line system. The word "link" as used herein generally refers to any one or more of an electrical conductor, a communication link, or a data link used for transporting various types of information and/or data. The word "current" as used herein generally refers to an electrical current. The word "concurrently" as used herein can be replaced in some example embodiments by alternative words and phrases such as "substantially concurrently," and "synchronously." Furthermore, the word "example" as used herein is intended to be non-exclusionary and non-limiting in nature. More particularly, the word "exemplary" as used herein indicates one among several examples, and it should be understood that no undue emphasis or preference is being directed to the particular example being described.

In terms of a general overview, certain embodiments of the systems and methods described herein pertain to determining a fault location in a three-phase series-compensated power transmission line system by using symmetrical components-based formulas that describe various voltage and current relationships in the three-phase series-compensated power transmission lines during a fault condition. Furthermore, the systems and methods for determining the fault location in accordance with certain embodiments of the disclosure can eliminate a need to calculate an impedance value of any of the series capacitors or the series capacitor protection elements that are a part of the three-phase series-compensated power transmission line system; a need to monitor any of the series capacitor protection elements; and/or a need to measure a voltage drop across any of the series capacitors.

Figure 1:
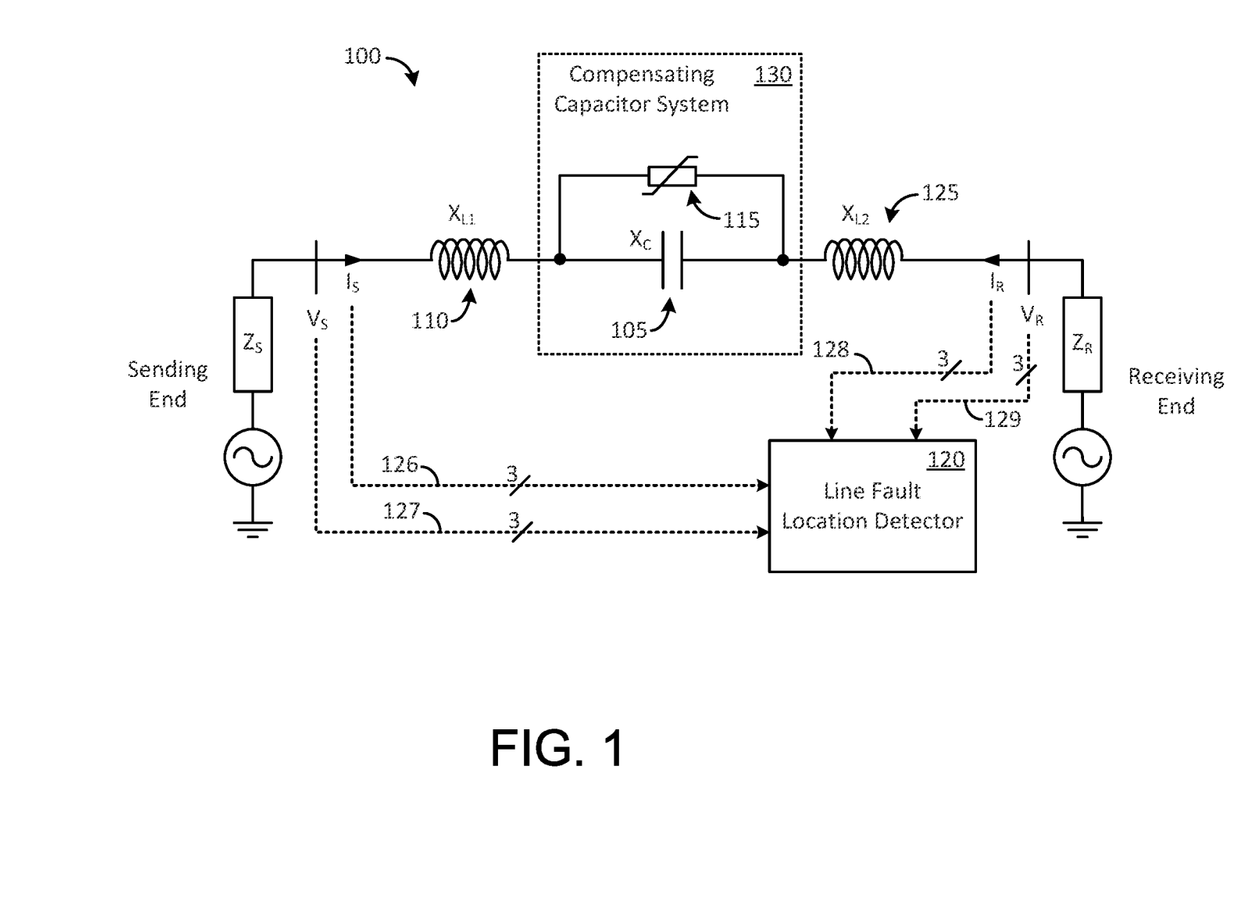
FIG. 1 illustrates a simplified representation of a three-phase series-compensated power transmission line that includes a line fault location detector in accordance with an example embodiment of the disclosure.

Attention is first drawn to FIG. 1, which illustrates a simplified representation of a three-phase series-compensated power transmission line system 100 that includes a line fault location detector 120 in accordance with an example embodiment of the disclosure. Even though only a single power transmission line is shown, it should be understood that the line fault location detector 120 is coupled to all three power transmission lines (two lines not shown) of the three-phase series-compensated power transmission line system 100. Accordingly, as shown in this example embodiment, a link 126 can represent three links that are used to transport electrical current measurements from a sending end of the three power transmission lines of the three-phase series-compensated power transmission line system 100, a link 127 can represent three links that are used to transport voltage measurements from the sending end of the three power transmission lines of the three-phase series-compensated power transmission line system 100, a link 128 can represent three links that are used to transport electrical current measurements from a receiving end of the three power transmission lines of the three-phase series-compensated power transmission line system 100, and a link 129 can represent three links that are used to transport voltage measurements from the receiving end of the three power transmission lines of the three-phase series-compensated power transmission line system 100.

In this exemplary embodiment, the line fault location detector 120 is coupled to all three power transmission lines closer towards the receiving end of the three-phase series-compensated power transmission line system 100 than the sending end. Consequently, the link 126 can be a first communication link that transports the electrical current measurements to the line fault location detector 120 in a digital communications format, for example. The link 127 can be a second communication link that transports the voltage measurements to the line fault location detector 120 in a digital communications format as well. Each or both of the links 128 and 129 can also be implemented in the form of communication links or as a result of the shorter transportation distance can be implemented in other ways, such as via analog links.

The simplified representation of the series-compensated power transmission line system 100 includes a series capacitor 105 that provides a compensating capacitance ($X_C$) to a distributed series inductance $X_L$ that is a part of an overall line impedance $Z_L$ of a power transmission line (where $Z_L=Z_{L1}+Z_{L2}$). The series capacitor 105 is typically implemented using a number of capacitors that are coupled together to form a capacitor bank. The distributed series inductance $X_L$ is schematically shown in FIG. 1 in the form of two series inductances $X_{L1}$ and $X_{L2}$, corresponding to $Z_{L1}$ and $Z_{L2}$ respectively. Specifically, the distributed series inductance $X_{L1}$ is shown as a series inductance 110 that is associated with a first transmission line segment extending from a sending end of the power transmission line to the series capacitor 105. The distributed series inductance ($X_{L2}$), is shown as a series inductance 125 that is associated with a second transmission line segment extending from the series capacitor 105 to the receiving end of the power transmission line. It should be understood that the placement of the series capacitor 105 in this exemplary embodiment defines two transmission line segments of the segments of the series-compensated power transmission line system 100. However, in another exemplary embodiment, the series capacitor 105 can be placed close to the receiving end of the series-compensated power transmission line system 100, thereby defining a single transmission line segment rather than two transmission line segments.

A series capacitor protection element 115 is coupled to the series capacitor 105 for protecting the series capacitor 105 when a fault occurs in the series-compensated power transmission line system 100. In one example implementation, the series capacitor protection element 115 can include a metal-oxide varistor (MOV). A combination of the series capacitor 105 and the series capacitor protection element 115 can be referred to as a compensating capacitor system 130. It should be understood that each of the other two power transmission lines (not shown) incorporates a similar compensating capacitor system as well.

The series-compensated power transmission line system 100 provides a compensated power transfer capacity that can be expressed by the following equation:

$$P = \frac{|V_S||V_R|}{|X_L - X_C|} \sin\delta \qquad \text{Eqn. (1)}$$

where δ represents a power angle, $V_S$ represents a first voltage at the sending end of the series-compensated power transmission line system 100 and $V_R$ represents a second voltage at the receiving end of the series-compensated power transmission line system 100.

The compensated power transfer capacity expressed by Eqn. (1) can provide an improvement over a power transfer capacity of an uncompensated power transmission line (not shown), where the power transfer capacity of the uncompensated power transmission line can be expressed by the following equation:

$$P = \frac{|V_S||V_R|}{|X_L|} \sin\delta \qquad \text{Eqn. (2)}$$

Figure 2:
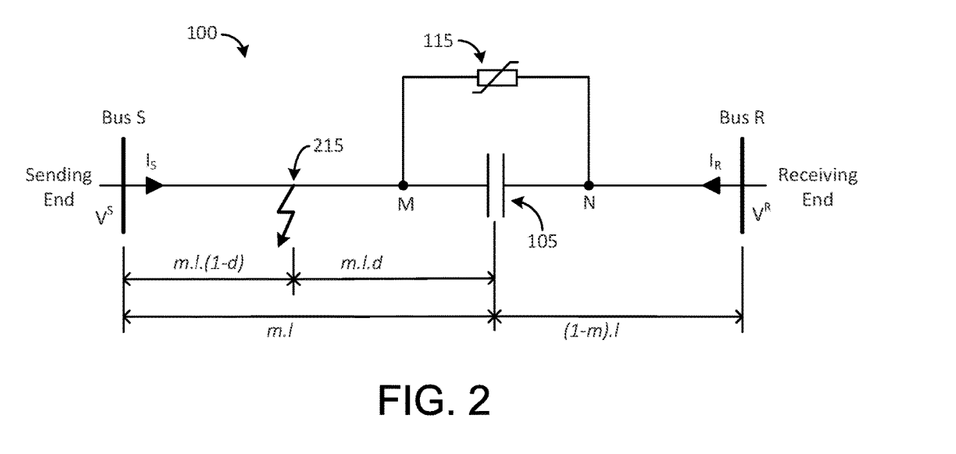
FIG. 2 illustrates an example circuit representation of a three-phase series-compensated power transmission line when a fault occurs between a series capacitor and a sending end of the three-phase series-compensated power transmission line according to an example embodiment of the disclosure.

Attention is now drawn to FIG. 2, which illustrates an example circuit representation of the series-compensated power transmission line system 100 when a fault occurs at a location 215 between the series capacitor 105 and a sending end of the series-compensated power transmission line system 100. The per unit distance "d" of the location 215 with reference to the series capacitor 105 can be determined using a fault location technique that is described below with respect to FIG. 3.

Figure 3:
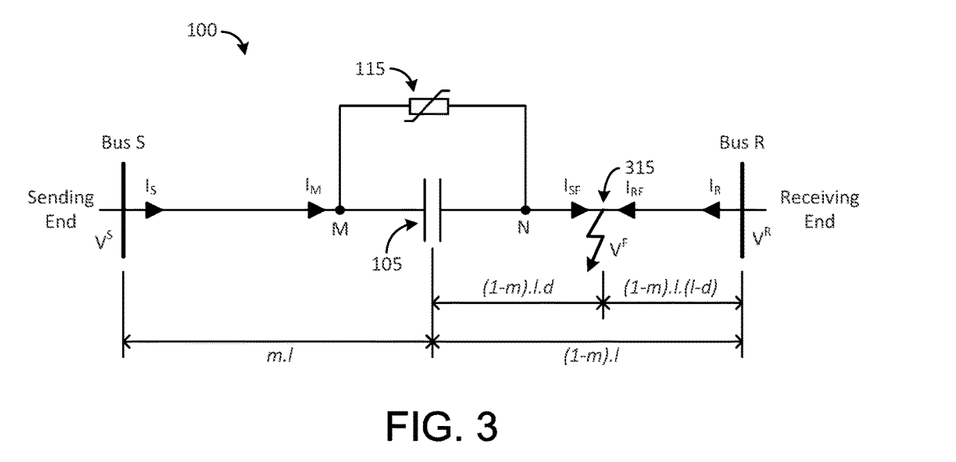
FIG. 3 illustrates another example circuit representation of a three-phase series-compensated power transmission line when a fault occurs between a series capacitor and a receiving end of the three-phase series-compensated power transmission line according to an example embodiment of the disclosure.

FIG. 3 illustrates a second example circuit representation of the series-compensated power transmission line system 100 when a fault occurs at a location 315 between the series capacitor 105 and a receiving end of the series-compensated power transmission line system 100 and at a per unit distance "d" from the series capacitor 105. The fault, which can be a single-phase fault to ground for example, can lead to a significantly higher-than-normal current flow through the series capacitor 105. The series capacitor protection element 115 turns active at this time to protect the series capacitor 105. The various equations and procedures that can be used for determining the fault location 315 will now be described using FIG. 4, which illustrates exemplary positive, negative and zero sequences associated with the example circuit representation shown in FIG. 3.

Figure 4:
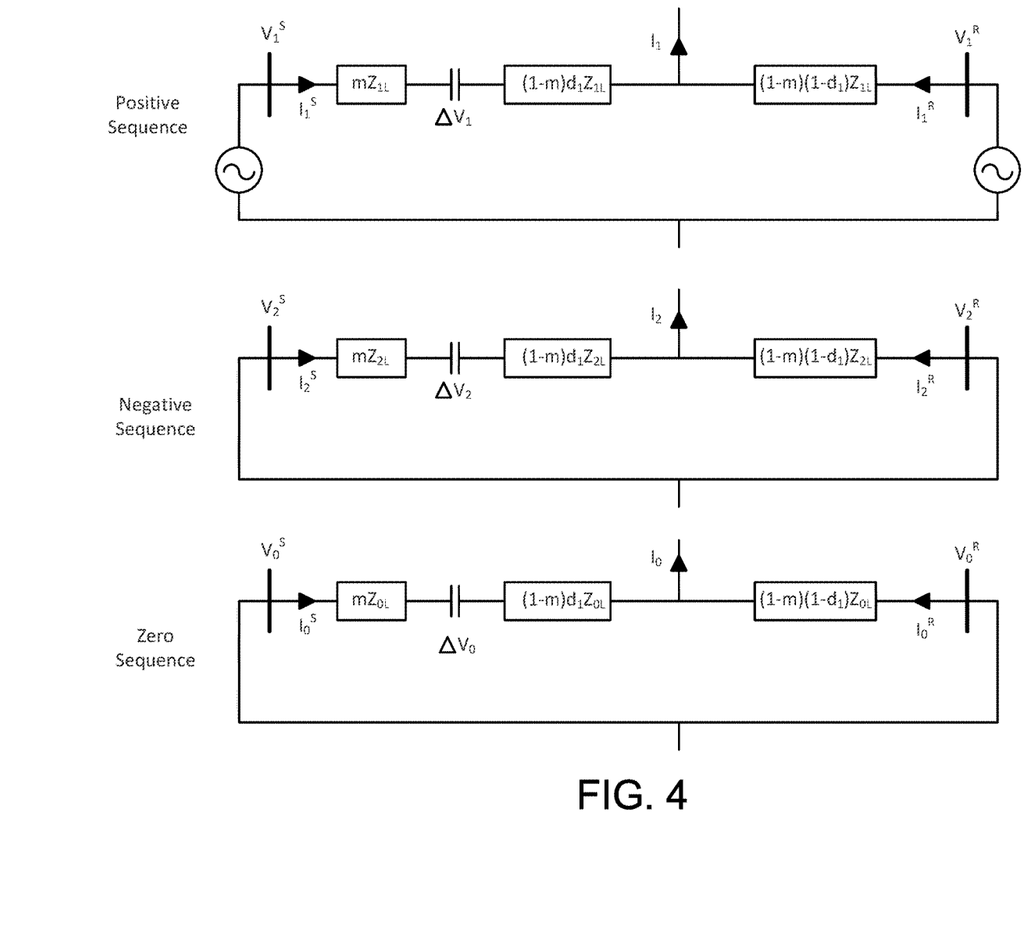
FIG. 4 illustrates exemplary positive, negative and zero sequences components networks associated with the example circuit representation shown in FIG. 3.

The per unit distance "d" of the location 315 can be determined in accordance with an exemplary embodiment of the disclosure by using the following positive, negative and zero sequences:

$$d(Pos) = (V_1^S - mI_1^S Z_{1L} - \Delta V_1 - V_1^R + (1-m)I_1^R Z_{1L})/(1-m)(I_1^S + I_1^R)Z_{1L} \quad \text{Eqn. (3)}$$

$$d(Neg) = (V_2^S - mI_1^S Z_{2L} - \Delta V_2 - V_2^R + (1-m)I_2^R Z_{2L})/(1-m)(I_2^S + I_2^R)Z_{2L} \quad \text{Eqn. (4)}$$

$$d(Zero) + (V_0^S - mI_1^S Z_{0L} - \Delta V_0 - V_0^R + (1-m)I_0^R Z_{0L})/(1-m)(I_0^S + I_0^R)Z_{0L} \quad \text{Eqn. (5)}$$

where (as shown in FIG. 4), $V_0^S$ is a zero sequence voltage component at the sending end of the series-compensated power transmission line system 100, $V_1^S$ is a positive sequence voltage component at the sending end of the series-compensated power transmission line system 100, $I_0^S$ is a zero sequence current component at the sending end of the series-compensated power transmission line system 100, $I_1^S$ is a positive sequence current component at the sending end of the series-compensated power transmission line system 100, $V_0^R$ is a zero sequence voltage component at the receiving end of the series-compensated power transmission line system 100, $V_1^R$ is a positive sequence voltage component at the receiving end of the series-compensated power transmission line system 100, $I_0^R$ is a zero sequence current component at the receiving end of the series-compensated power transmission line system 100, $I_1^R$ is a positive sequence current component at the receiving end of the series-compensated power transmission line system 100, $Z_{0L}$ is a zero sequence total impedance component of the series-compensated power transmission line system 100, and $Z_{1L}$ is a positive sequence total impedance component of the series-compensated power transmission line system 100.

The per unit distance "d" of the fault at location 315 cannot be determined directly based on Eqns. (3), (4), and (5) above because the sequence components $\Delta V_0$, $\Delta V_1$, and $\Delta V_2$ are not known. It may be pertinent to point out at this point that in contrast to the approach provided below in accordance with the disclosure for determining "d" based on solving Eqns. (3), (4), and (5), some conventional approaches use certain assumptions that can lead to erroneous results. For example, in one conventional approach, an estimate of a voltage drop across a series capacitor protection element (such as the series capacitor protection element 115) is estimated on the basis of a MOV model. One or more simulations using electromagnetic transients programs are then carried out for different current levels from which the per unit distance "d" is determined. In this approach, not only is the calculation based on using only one end of a power transmission line but is also susceptible to providing erroneous results because the MOV model may not take into consideration various conditions such as ambient temperature and aging effects that can alter the characteristics of the MOV.

In another conventional approach, the use of a MOV model is avoided and measurements carried out from both ends of a series-compensated power transmission line are used. In this particular conventional approach, estimated voltages and current at a fault location are used for determining the fault location. However, in this conventional approach the voltage at a fault location is estimated using measurements from a first end of the series-compensated power transmission line that does not have a series capacitor system located between the fault location and the first end, which can yield erroneous results due to phasor estimation errors under certain types of fault conditions Consequently, in contrast to such conventional approaches, and in accordance with an embodiment of the disclosure, the per unit distance "d" of the fault at location 315 can be determined by interpreting the combination of the series capacitor 105 and the series capacitor protection element 115 as a collective impedance representing the combined impedance of the series capacitor 105 and the series capacitor protection element 115 when a fault occurs in the series-compensated power transmission line system 100.

The sequence impedance matrix of this collective impedance can be defined as follows:

$$Z_S = A^{-1} Z_P A \quad \text{Eqn. (6)}$$

where $$A = \begin{bmatrix} 1 & 1 & 1 \\ 1 & \alpha^2 & \alpha \\ 1 & \alpha & \alpha^2 \end{bmatrix};$$

$\alpha = 1 < 120$ degrees; $Z_S$ is the sequence impedance matrix of the collective impedance; and $Z_P$ is the phase impedance matrix of the collective impedance.

Eqn. (6) can be expanded as follows:

$$Z_S = \frac{1}{3} \begin{bmatrix} 1 & 1 & 1 \\ 1 & \alpha & \alpha^2 \\ 1 & \alpha^2 & \alpha \end{bmatrix} \begin{bmatrix} Z_A & 0 & 0 \\ 0 & Z_B & 0 \\ 0 & 0 & Z_C \end{bmatrix} \begin{bmatrix} 1 & 1 & 1 \\ 1 & \alpha^2 & \alpha \\ 1 & \alpha & \alpha^2 \end{bmatrix} \quad \text{Eqn. (7)}$$

Eqn. (7) can be rewritten as follows:

$$Z_S = \frac{1}{3} \begin{bmatrix} Z_A + Z_B + Z_C & Z_A + \alpha^2 Z_B + \alpha Z_C & Z_A + \alpha Z_B + \alpha^2 Z_C \\ Z_A + \alpha Z_B + \alpha^2 Z_C & Z_A + Z_B + Z_C & Z_A + \alpha^2 Z_B + \alpha Z_C \\ Z_A + \alpha^2 Z_B + \alpha Z_C & Z_A + \alpha Z_B + \alpha^2 Z_C & Z_A + Z_B + Z_C \end{bmatrix} \quad \text{Eqn. (8)}$$

where $Z_A$, $Z_B$, and $Z_C$ are the impedances of the combination of the series capacitor 105 and the series capacitor protection element 115 (i.e. the collective impedance) when applied to phases A, B, and C of a three-phase series-compensated power transmission line. The sequence component of a voltage drop across the combination of the series capacitor 105 and the series capacitor protection element 115 can be expressed as follows:

$$\begin{bmatrix} \Delta V_0 \\ \Delta V_1 \\ \Delta V_2 \end{bmatrix} = \quad \text{Eqn. (9)}$$

-continued $$\frac{1}{3}\begin{bmatrix} Z_A+Z_B+Z_C & Z_A+\alpha^2 Z_B+\alpha Z_C & Z_A+\alpha Z_B+\alpha^2 Z_C \\ Z_A+\alpha Z_B+\alpha^2 Z_C & Z_A+Z_B+Z_C & Z_A+\alpha^2 Z_B+\alpha Z_C \\ Z_A+\alpha^2 Z_B+\alpha Z_C & Z_A+\alpha Z_B+\alpha^2 Z_C & Z_A+Z_B+Z_C \end{bmatrix}$$

$$\begin{bmatrix} I_0^M \\ I_1^M \\ I_2^M \end{bmatrix}$$

where $I_0^M$, $I_1^M$, and $I_2^M$ are zero, positive, and negative sequence components of a current flowing through the impedances of the combination of the series capacitor 105 and the series capacitor protection element 115. For the fault location 315, the values of $I_0^M$, $I_1^M$, and $I_2^M$ can be estimated by voltage and current measurements obtained from the sending end of the series-compensated power transmission line system 100. It will be pertinent at this point to draw attention to the current $I_M$ that is shown in FIG. 3. Though $I_M$ can be assumed equal to $I_S$ for purposes of some calculations, in one example embodiment in accordance with the disclosure, $I_M$ is different from $I_S$ due to various factors such as the presence of shunt line capacitance in the first transmission line segment between the sending end and the series capacitor 105, however, $I_M$ can be estimated by voltage and current measurements obtained from the sending end of the series-compensated power transmission line system. Furthermore, it will be pertinent to point out that when no fault is present in the three-phase series-compensated power transmission line, $Z_A=Z_B=Z_C=-jX_{cap}$ where $X_{cap}$ is the reactance of the series capacitor in each of the A, B, and C phases of the three-phase series-compensated power transmission line.

Equations and formulae pertaining to a single phase to ground fault condition and a double phase to ground fault condition will now be described. Typically, in a single phase to ground fault condition, only a single series capacitor protection element (the one located in the faulted phase line) will be conducting in accordance with a fault current amplitude. Consequently, the collective impedance $Z_A$ of the compensating capacitor system 130 in the faulted phase line A is an undetermined impedance parameter $Z'$ whereas the impedances of the remaining un-faulted phase lines B and C, each having a series capacitor, can be defined as $Z_B=-jX_{cap}$ and $Z_C=-jX_{cap}$. Substituting these values into Eqn. (9) provides the following:

$\Delta V_1 = \frac{1}{3}[Z'(I_0^M+I_1^M+I_2^M)-jX_{cap}(2I_1^M-I_2^M-I_0^M)]$  Eqn. (10)

$\Delta V_2 = \frac{1}{3}[Z'(I_0^M+I_1^M+I_2^M)-jX_{cap}(2I_2^M-I_0^M-I_1^M)]$  Eqn. (11)

$\Delta V_0 = \frac{1}{3}[Z'(I_0^M+I_1^M+I_2^M)-jX_{cap}(2I_0^M-I_1^M-I_2^M)]$  Eqn. (12)

Subtracting Eqn. (12) from Eqn. (10) provides the following:

$\Delta V_1 - \Delta V_0 = -jX_{cap}(I_1^M - I_0^M)$  Eqn. (13)

Furthermore, subtracting Eqn. (12) from Eqn. (11) provides the following:

$(\Delta V_2 - \Delta V_0) = -jX_{cap}(I_2^M - I_0^M)$  Eqn. (14)

Combining Eqn. (3) and Eqn. (5) and eliminating the undetermined impedance parameter $Z'$ results in the following:

$$d = \frac{(V_1^S - V_0^S) - m(I_1^S Z_{1L} - I_0^S Z_{0L}) - (\Delta V_1 - \Delta V_0) -}{(V_1^R - V_0^R) + (1-m)(I_1^R Z_{1L} - I_0^R Z_{0L})} \quad \text{Eqn. (15)}$$
$$\overline{(1-m)((I_1^S + I_1^R)Z_{1L} - (I_0^S + I_0^R)Z_{0L})}$$

Substituting the expression $(\Delta V_1 - \Delta V_0)$ from Eqn. (13) into Eqn. (15) results in the following expression that can be used to determine the per unit distance "d" of the fault at location 315:

$$d = \frac{(V_1^S - V_0^S) - m(I_1^S Z_{1L} - I_0^S Z_{0L}) + jX_{cap}(I_1^M - I_0^M) -}{(V_1^R - V_0^R) + (1-m)(I_1^R Z_{1L} - I_0^R Z_{0L})} \quad \text{Eqn. (16)}$$
$$\overline{(1-m)((I_1^S + I_1^R)Z_{1L} - (I_0^S + I_0^R)Z_{0L})}$$

The per unit distance "d" of the fault at location 315 can also be determined by using Eqn. (14) in lieu of Eqn. (13). Towards this end, Eqn. (4) can be combined with Eqn. (5) and the undetermined impedance parameter $Z'$ eliminated, thus resulting in the following:

$$d = \frac{(V_2^S - V_0^S) - m(I_2^S Z_{2L} - I_0^S Z_{0L}) - (\Delta V_2 - \Delta V_0) -}{(V_2^R - V_0^R) + (1-m)(I_2^R Z_{2L} - I_0^R Z_{0L})} \quad \text{Eqn. (17)}$$
$$\overline{(1-m)((I_2^S + I_2^R)Z_{2L} - (I_0^S + I_0^R)Z_{0L})}$$

Substituting the expression $(\Delta V_2 - \Delta V_0)$ from Eqn. (14) into Eqn. (17) results in the following expression that can be alternatively used in lieu of Eqn. (16) for determining the per unit distance "d" of the fault at location 315:

$$d = \frac{(V_2^S - V_0^S) - m(I_2^S Z_{2L} - I_0^S Z_{0L}) + jX_{cap}(I_2^M - I_0^M) -}{(V_2^R - V_0^R) + (1-m)(I_2^R Z_{2L} - I_0^R Z_{0L})} \quad \text{Eqn. (18)}$$
$$\overline{(1-m)((I_2^S + I_2^R)Z_{2L} - (I_0^S + I_0^R)Z_{0L})}$$

Equations and formulae pertaining to a double phase to ground fault condition will now be described. In this example double phase to ground fault condition, each of phase B and phase C develop fault conditions while Phase A is in a normal condition (i.e., no faults). As a result, the respective series capacitor protection elements in phases B and C are in an active state and the series capacitor protection element 115 in phase A is in an idle state (whereby current is flowing through the series capacitor 105 in Phase A and a zero (or insignificant) amount of current is flowing through the series capacitor protection element 115). Thus, $Z_A=-jX_{cap}$ and $Z_B=Z_C=$undetermined impedance parameter $Z'$. Substituting these values into Eqn. (9) results in the following:

$\Delta V_1 = \frac{1}{3}[-jX_{cap}(I_0^M+I_1^M+I_2^M)-Z'(2I_1^M-I_2^M-I_0^M)]$  Eqn. (19)

$\Delta V_2 = \frac{1}{3}[jX_{cap}(I_0^M+I_1^M+I_2^M)-Z'(2I_2^M-I_0^M-I_1^M)]$  Eqn. (20)

$\Delta V_0 = \frac{1}{3}[jX_{cap}(I_0^M+I_1^M+I_2^M)-Z'(2I_0^M-I_1^M-I_2^M)]$  Eqn. (21)

Adding Eqns. (19), (20) and (21) results in the following:

$$\sum_{i=0}^{2} \Delta V_i = \quad \text{Eqn. (22)}$$

-continued $$\Delta V_1 + \Delta V_2 + \Delta V_0 = -jX_{cap}(I_1^M + I_2^M + I_0^M) = -jX_{cap}\sum_{i=0}^{2}I_i^M$$

Combining Eqns. (3), (4) and (5) and eliminating the undetermined impedance parameter Z' results in the following:

$$d = \frac{\sum_{i=0}^{2}V_i^S - m\sum_{i=0}^{2}I_i^S Z_{iL} + jX_{cap}I_A^M - \sum_{i=0}^{2}V_i^R + (1-m)\sum_{i=0}^{2}I_i^R Z_{iL}}{(1-m)\sum_{i=0}^{2}(I_i^S + I_i^R)Z_{iL}} \quad \text{Eqn. (23)}$$

Substituting $$\sum_{i=0}^{2}\Delta V_i = -jX_{cap}\sum_{i=0}^{2}I_i^M$$

from Eqn. (22) into Eqn. (23) results in the following expression that can be used to determine the per unit distance "d" of the double-phase-to-ground fault from the series capacitor protection element:

$$d = \frac{\sum_{i=0}^{2}V_i^S - m\sum_{i=0}^{2}I_i^S Z_{iL} + jX_{cap}I_A^M - \sum_{i=0}^{2}V_i^R + (1-m)\sum_{i=0}^{2}I_i^R Z_{iL}}{(1-m)\sum_{i=0}^{2}(I_i^S + I_i^R)Z_{iL}} \quad \text{Eqn. (24)}$$

where $V_i^S$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $V_i^R$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $I_i^S$ represents each of a zero sequence current component (i=0) at the sending end of the three-phase series-compensated power line system, a positive sequence current component (i=1) at the sending end of the three-phase series-compensated power line system, and a negative sequence current component (i=2) at the sending end of the three-phase series-compensated power line system; $I_i^R$ represents each of a zero sequence current component (i=0) at the receiving end of the three-phase series-compensated power line system, a positive sequence current component (i=1) at the receiving end of the three-phase series-compensated power line system, and a negative sequence current component (i=2) at the receiving end of the three-phase series-compensated power line system; $Z_{iL}$ represents each of a zero sequence total impedance component (i=0), a positive sequence total impedance component (i=1) of the three-phase series-compensated power line system, and a negative sequence total impedance component (i=2) of the three-phase series-compensated power line system, $I_0^M$ is an estimated zero sequence current component propagating through the first, second, and third compensating capacitor systems, $I_1^M$ is an estimated positive sequence current component propagating through the first, second, and third compensating capacitor systems, and $I_2^M$ is an estimated negative sequence current component propagating through the first, second, and third compensating capacitor systems.

Figure 5:
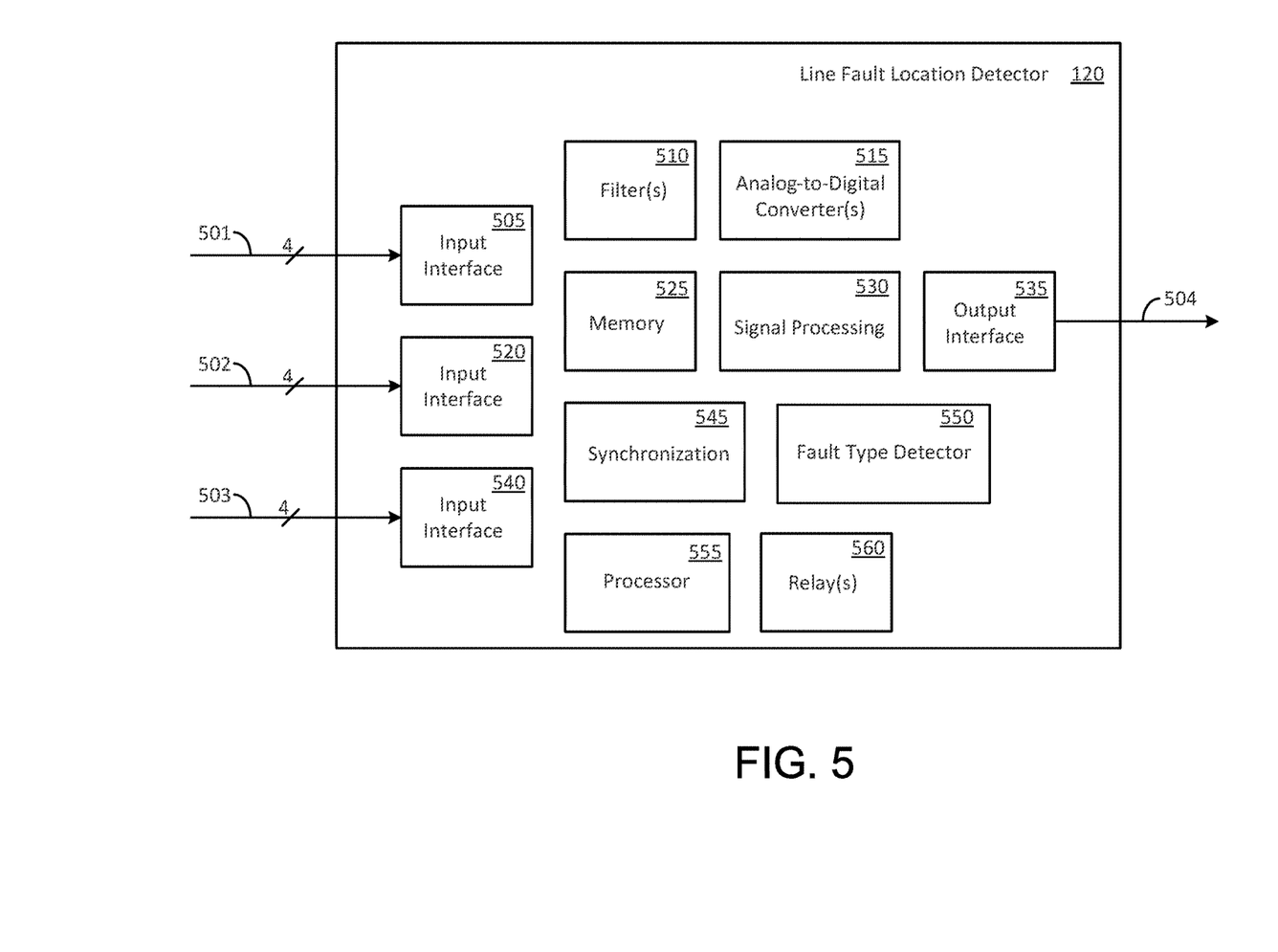
FIG. 5 illustrates a few example components contained in a line fault location detector in accordance with an exemplary embodiment of the disclosure.

Attention is now drawn to FIG. 5, which illustrates a few example components that can be included in the line fault location detector 120 in accordance with an exemplary embodiment of the disclosure. In this exemplary embodiment, the line fault location detector 120 can include a number of input interfaces that are configured to receive various kinds of input data and can also include a number of output interfaces that are configured to transmit various kinds of signals such as control signals and fault location related signals to other devices (not shown) such as an alarm monitoring unit, a display unit, a user interface device, and/or an alarm. Among the exemplary input interfaces shown, a first input interface 505 can be configured to receive a set of electrical current measurements and a set of voltage measurements (via a link 501) from one of the three-phase series-compensated power transmission lines of the series-compensated power transmission line system 100. For example, the link 501 can represent one line from each of links 126 and 127 (shown in FIG. 1) that are coupled to a sending end of the series-compensated power transmission line system 100 and one line from each of links 128 and 129 (shown in FIG. 1) that are coupled to a receiving end of the series-compensated power transmission line system 100 (total of 4 lines) can be coupled into the first input interface 505.

It should be understood that this coupling configuration is merely one example among many, and in other configurations, the first input interface 505 can have fewer or larger number of circuits that are coupled to fewer or larger number of monitoring elements associated with the series-compensated power transmission line system 100. Accordingly, the first input interface 505 can include appropriate circuitry for receiving and processing various types of signals. For example, with respect to the example system configuration shown in FIG. 1, the first input interface 505 can include communications interfaces configured to receive electrical current measurements and voltage measurements in a first digital communications format via the lines 126 and 127 from the sending end of the series-compensated power transmission line system 100, and can further include one or more different types of interface for receiving other electrical current measurements and voltage measurements via the lines 128 and 129 in a second digital communications format (or an analog format), from the receiving end of the series-compensated power transmission line system 100.

The second interface 520 and the third interface 540 can be configured similar to the first input interface 505 in order receive electrical current measurements and voltage measurements from the other two of the three-phase series-compensated power transmission lines of the series-compensated power transmission line system 100 (via the links 502 and 503).

The line fault location detector 120 can include one or more output interfaces such as an output interface 535 that can be used for transmitting via line 504 various status and/or control signals. The line fault location detector 120 can also include one or more analog-to-digital converters and one or more digital-to-analog converters (not shown). For example, an analog-to-digital converter 515 can be used to convert an electrical current measurement provided by one of the input interfaces in an analog form into a digital current measurement value that can be processed by the processor 555. Conversely, a digital-to-analog converter can be used to convert various types of digital information that can be provided by the processor 555, into an analog output signal that can be transmitted out of the line fault location detector 120 via the output interface 504. A signal processing module 530 can be used to process digital signals, provided by the analog-to-digital converter 515 for example.

One or more relays, such as a relay 560, can be used for various types of switching purposes. For example, the relay 560 can be used to switch various currents and/or alarm signals when a fault is detected in the series-compensated power transmission line system 100. A fault type detector 550 can be used for identifying the nature of a fault in the series-compensated power transmission line system 100 such as a short-circuit to ground. A synchronization module 545 can be used to ensure that the various electrical current measurements and the voltage measurements specifically relate to synchronous measurements that are carried out at the sending end and the receiving end of the series-compensated power transmission line system 100. As can be understood, the synchronous fault-related measurements are obtained by concurrently executing a synchronous measurement procedure at both the sending end and the receiving end of the series-compensated power transmission line system 100. In one example implementation, the various electrical current measurements and the voltage measurements can be provided to the line fault location detector 120 in the form of synchrophasors. The synchrophasors, which represent time-synchronized measurement data indicative of both magnitude information and phase information of the various electrical current measurements and the voltage measurements, can be obtained via phasor measurement units (PMUs) for example.

One or more processors, such as the processor 555, can be configured to communicatively cooperate with various elements contained in the line fault location detector 120, including a memory 525. The processor 555 can be implemented and operated using appropriate hardware, software, firmware, or combinations thereof. Software or firmware implementations can include computer-executable or machine-executable instructions written in any suitable programming language to perform the various functions described. In one embodiment, instructions associated with a function block language can be stored in the memory 525 and executed by the processor 555.

The memory 525 can be used to store program instructions that are loadable and executable by the processor 555, as well as to store data generated during the execution of these programs. Depending on the configuration and type of the line fault location detector 120, the memory 525 can be volatile (such as random access memory (RAM)) and/or non-volatile (such as read-only memory (ROM), flash memory, etc.). In some embodiments, the memory devices can also include additional removable storage (not shown) and/or non-removable storage (not shown) including, but not limited to, magnetic storage, optical disks, and/or tape storage. The disk drives and their associated computer-readable media can provide non-volatile storage of computer-readable instructions, data structures, program modules, and other data. In some implementations, the memory 525 can include multiple different types of memory, such as static random access memory (SRAM), dynamic random access memory (DRAM), or ROM.

The memory 525, the removable storage, and the non-removable storage are all examples of non-transient computer-readable storage media. Such non-transient computer-readable storage media can be implemented in any method or technology for storage of information such as computer-readable instructions, data structures, program modules or other data. Additional types of non-transient computer storage media that can be present include, but are not limited to, programmable random access memory (PRAM), SRAM, DRAM, ROM, electrically erasable programmable read-only memory (EEPROM), compact disc read-only memory (CD-ROM), digital versatile discs (DVD) or other optical storage, magnetic cassettes, magnetic tapes, magnetic disk storage or other magnetic storage devices, or any other medium which can be used to store the desired information and which can be accessed by the processor 555. Combinations of any of the above should also be included within the scope of non-transient computer-readable media.

Turning to the contents of the memory 525, the memory 525 can include, but is not limited to, an operating system (OS) and one or more application programs or services for implementing the features and aspects disclosed herein. Such applications or services can include a line fault location detector module (not shown). In one embodiment, the line fault location detector module can be implemented by software that is provided in configurable control block language and is stored in non-volatile memory. When executed by the processor 555, the line fault location detector module can implement the various functionalities and features described in this disclosure.

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A three-phase series-compensated power line system comprising:
    a first series-compensated power transmission line configured to propagate electrical power having a first phase, the first series-compensated power transmission line including a first compensating capacitor system comprising a first series capacitor and a first series capacitor protection element;
    a second series-compensated power transmission line configured to propagate electrical power having a second phase, the second series-compensated power transmission line including a second compensating capacitor system comprising a second series capacitor and a second series capacitor protection element;
    a third series-compensated power transmission line configured to propagate electrical power having a third phase, the third series-compensated power transmission line including a third compensating capacitor system comprising a third series capacitor and a third series capacitor protection element; and a line fault location detector comprising at least one processor, the at least one processor configured to execute a first fault location procedure for identifying a location of a single-phase-to-ground fault in the three-phase series-compensated power line system, the first fault location procedure comprising:

determining a zero sequence voltage drop based in part on a relationship between a first impedance presented by the first compensating capacitor system during the single-phase-to-ground fault, a second impedance presented by the second compensating capacitor system during the single-phase-to-ground fault, and a third impedance presented by the third compensating capacitor system during the single-phase-to-ground fault, wherein one of the first impedance, the second impedance, or the third impedance is an undetermined impedance that is attributable to a corresponding one of the first series capacitor protection element, the second series capacitor protection element, or the third series capacitor protection element turning active during the single-phase-to-ground fault;

determining at least one of a positive sequence voltage drop or a negative sequence voltage drop based in part on the relationship between the first impedance, the second impedance, and the third impedance; and determining the location of the single-phase-to-ground fault at least in part, by using the zero sequence voltage drop and the at least one of the positive sequence voltage drop or the negative sequence voltage drop to eliminate determining of the undetermined impedance, wherein the location is indicated to an output interface.

2. The system of claim 1, wherein executing the first fault location procedure further comprises receiving in the line fault location detector, a plurality of electrical current measurements and a plurality of voltage measurements obtained by using a synchronous measurement procedure concurrently executed at a sending end and a receiving end of the first series-compensated power transmission line.

3. The system of claim 2, wherein executing the first fault location procedure precludes calculating an impedance value of any of the first series capacitor protection element, the second series capacitor protection element, or the third series capacitor protection element; precludes monitoring a status of any of the first, second, or third series capacitor protection elements; and precludes measuring a voltage drop across any of the first, second, or third series capacitors.

4. The system of claim 2, wherein the line fault location detector is located closer to the receiving end than the sending end of the three-phase series-compensated power line system.

5. The system of claim 1, wherein using the zero sequence voltage drop and the at least one of the positive sequence voltage drop or the negative sequence voltage drop for determining the location of the single-phase-to-ground fault comprises subtracting the zero sequence voltage drop from the positive sequence voltage drop and further comprises solving the following equation:

$$d1 = \frac{(V_1^S - V_0^S) - m(I_1^S Z_{1L} - I_0^S Z_{0L}) + jX_{cap}(I_1^M - I_0^M) - (V_1^R - V_0^R) + (1-m)(I_1^R Z_{1L} - I_0^R Z_{0L})}{(1-m)((I_1^S + I_1^R)Z_{1L} - (I_0^S + I_0^R)Z_{0L})}$$

wherein d1 is indicative of a distance to the single-phase-to-ground fault location, $V_0^S$ is a zero sequence voltage component at a sending end of the three-phase series-compensated power line system, $V_1^S$ is a positive sequence voltage component at the sending end of the three-phase series-compensated power line system, $I_0^S$ is a zero sequence current component at the sending end of the first series-compensated power transmission line, $I_1^S$ is a positive sequence current component at the sending end of the three-phase series-compensated power line system, $V_0^R$ is a zero sequence voltage component at a receiving end of the three-phase series-compensated power line system, $V_1^R$ is a positive sequence voltage component at the receiving end of the three-phase series-compensated power line system, $I_0^R$ is a zero sequence current component at the receiving end of the three-phase series-compensated power line system, $I_1^R$ is a positive sequence current component at the receiving end of the three-phase series-compensated power line system, $I_{0L}$ is a zero sequence total impedance component of the three-phase series-compensated power line system, $Z_{1L}$, is a positive sequence total impedance component of the three-phase series-compensated power line system, $I_0^M$ is an estimated zero sequence current component propagating through the first, second, and third compensating capacitor systems, and $I_1^M$ is an estimated positive sequence current component propagating through the first, second, and third compensating capacitor systems.

6. The system of claim 1, wherein using the zero sequence voltage drop and the at least one of the positive sequence voltage drop or the negative sequence voltage drop for determining the location of the single-phase-to-ground fault comprises subtracting the zero sequence voltage drop from the negative sequence voltage drop and further comprises solving the following equation:

$$d1 = \frac{(V_2^S - V_0^S) - m(I_2^S Z_{2L} - I_0^S Z_{0L}) + jX_{cap}(I_2^M - I_0^M) - (V_2^R - V_0^R) + (1-m)(I_2^R Z_{2L} - I_0^R Z_{0L})}{(1-m)((I_2^S + I_2^R)Z_{2L} - (I_0^S + I_0^R)Z_{0L})}$$

wherein d1 is indicative of a distance to the single-phase-to-ground fault location, $V_0^S$ is a zero sequence voltage component at a sending end of the three-phase series-compensated power line system, $V_2^S$ is a negative sequence voltage component at the sending end of the three-phase series-compensated power line system, $I_0^S$ is a zero sequence current component at the sending end of the first series-compensated power transmission line, $I_2^S$ is a negative sequence current component at the sending end of the three-phase series-compensated power line system, $V_0^R$ is a zero sequence voltage component at a receiving end of the three-phase series-compensated power line system, $I_2^R$ is a negative sequence voltage component at the receiving end of the three-phase series-compensated power line system, $Z_{0L}$ is a zero sequence current component at the receiving end of the three-phase series-compensated power line system, $I_2^R$ is a negative sequence current component at the receiving end of the three-phase series-compensated power line system, $Z_{0L}$ is a zero sequence total impedance component of the three-phase series-compensated power line system, $Z_{2L}$ is a negative sequence total impedance component of the three-phase series-compensated power line system, $I_0^M$ is an estimated zero sequence current component propagating through the first, second, and third compensating capacitor systems, and $I_2^M$ is an estimated negative sequence current component propagating through the first, second, and third compensating capacitor systems.

7. The system of claim 1, wherein the at least one processor of the line fault location detector is further configured to execute a second fault location procedure for identifying a location of a double-phase-to-ground fault in the three-phase series-compensated power line system, the double-phase-to-ground fault characterized in part by any two of the first series capacitor protection element, the second series capacitor protection element, and the third series capacitor protection element turning active.

8. The system of claim 7, wherein executing the second fault location procedure comprises solving the following equation:

$$d2 = \frac{\sum_{i=0}^{2} V_i^S - m \sum_{i=0}^{2} I_i^S Z_{iL} + jX_{cap} I_A^M - \sum_{i=0}^{2} V_i^R + (1-m) \sum_{i=0}^{2} I_i^R Z_{iL}}{(1-m) \sum_{i=0}^{2} (I_i^S + I_i^R) Z_{iL}}$$

wherein d2 is indicative of a distance to the double-phase-to-ground fault; $V_i^S$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $V_i^R$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $I_i^S$ represents each of a zero sequence current component (i=0) at the sending end of the three-phase series-compensated power line system, a positive sequence current component (i=1) at the sending end of the three-phase series-compensated power line system, and a negative sequence current component (i=2) at the sending end of the three-phase series-compensated power line system; $I_i^R$ represents each of a zero sequence current component (i=0) at the receiving end of the three-phase series-compensated power line system, a positive sequence current component (i=1) at the receiving end of the three-phase series-compensated power line system, and a negative sequence current component (i=2) at the receiving end of the three-phase series-compensated power line system; $Z_{iL}$ represents each of a zero sequence total impedance component (i=0), a positive sequence total impedance component (i=1) of the three-phase series-compensated power line system, and a negative sequence total impedance component (i=2) of the three-phase series-compensated power line system, $I_0^M$ is an estimated zero sequence current component propagating through the first, second, and third compensating capacitor systems, $I_1^M$ is an estimated positive sequence current component propagating through the first, second, and third compensating capacitor systems, and $I_2^M$ is an estimated negative sequence current component propagating through the first, second, and third compensating capacitor systems.

9. The system of claim 8, wherein executing the second fault location procedure precludes calculating an impedance value of any of the first series capacitor protection element, the second series capacitor protection element, or the third series capacitor protection element; precludes monitoring a status of any of the first, second, or third series capacitor protection elements; and precludes measuring a voltage drop across any of the first, second, or third series capacitors.

10. A line fault location detector coupled to a three-phase series-compensated power line system, the line fault location detector comprising:
a plurality of input interfaces configured to receive a set of electrical current measurements and a set of voltage measurements that are obtained via a synchronous measurement procedure concurrently executed at a sending end and a receiving end of the three-phase series-compensated power transmission line system; and
at least one processor configured to use the set of electrical current measurements and the set of voltage measurements to execute a first fault location procedure for identifying a location of a single-phase-to-ground fault in the three-phase series-compensated power line system, the first fault location procedure comprising:
determining a zero sequence voltage drop based in part on a relationship between a first impedance presented by the first compensating capacitor system during the single-phase-to-ground fault, a second impedance presented by the second compensating capacitor system during the single-phase-to-ground fault, and a third impedance presented by the third compensating capacitor system during the single-phase-to-ground fault, wherein one of the first impedance, the second impedance, or the third impedance is an undetermined impedance that is attributable to a corresponding one of the first series capacitor protection element, the second series capacitor protection element, or the third series capacitor protection element turning active during the single-phase-to-ground fault;
determining at least one of a positive sequence voltage drop or a negative sequence voltage drop based in part on the relationship between the first impedance, the second impedance, and the third impedance; and
determining the location of the single-phase-to-ground fault at least in part, by using the zero sequence voltage drop and the at least one of the positive sequence voltage drop or the negative sequence voltage drop to eliminate determining of the undetermined impedance, wherein the location is indicated to an output interface.

11. The detector of claim 10, wherein using the zero sequence voltage drop and the at least one of the positive sequence voltage drop or the negative sequence voltage drop for determining the location of the single-phase-to-ground fault comprises subtracting the zero sequence voltage drop from the positive sequence voltage drop and further comprises solving the following equation:

$$d1 = \frac{(V_1^S - V_0^S) - m(I_1^S Z_{1L} - I_0^S Z_{0L}) + jX_{cap}(I_1^M - I_0^M) - (V_1^R - V_0^R) + (1-m)(I_1^R Z_{1L} - I_0^R Z_{0L})}{(1-m)((I_1^S + I_1^R)Z_{1L} - (I_0^S + I_0^R)Z_{0L})}$$

wherein d1 is indicative of a distance to the single-phase-to-ground fault location, $V_0^S$ is a zero sequence voltage component at a sending end of the three-phase series-compensated power line system, $V_1^S$ is a positive sequence voltage component at the sending end of the three-phase series-compensated power line system, $I_0^S$ is a zero sequence current component at the sending end of the first series-compensated power transmission line, $I_1^S$ is a positive sequence current component at the sending end of the three-phase series-compensated power line system, $V_0^R$ is a zero sequence voltage component at a receiving end of the three-phase series-compensated power line system, $V_1^R$ is a positive sequence voltage component at the receiving end of the three-phase series-compensated power line system, $I_0^R$ is a zero sequence current component at the receiving end of the three-phase series-compensated power line system, $I_1^R$ is a positive sequence current component at the receiving end of the three-phase series-compensated power line system, $Z_{0L}$ is a zero sequence total impedance component of the three-phase series-compensated power line system, $Z_{1L}$ is a positive sequence total impedance component of the three-phase series-compensated power line system, $I_0^M$ is an estimated zero sequence current component propagating through the first, second, and third compensating capacitor systems, and $I_1^M$ is an estimated positive sequence current component propagating through the first, second, and third compensating capacitor systems.

12. The detector of claim 10, wherein using the zero sequence voltage drop and the at least one of the positive sequence voltage drop or the negative sequence voltage drop for determining the location of the single-phase-to-ground fault comprises subtracting the zero sequence voltage drop from the negative sequence voltage drop and further comprises solving the following equation:

$$d1 = \frac{(V_2^S - V_0^S) - m(I_2^S Z_{2L} - I_0^S Z_{0L}) + jX_{cap}(I_2^M - I_0^M) - (V_2^R - V_0^R) + (1-m)(I_2^R Z_{2L} - I_0^R Z_{0L})}{(1-m)((I_2^S + I_2^R)Z_{2L} - (I_0^S + I_0^R)Z_{0L})}$$

wherein d1 is indicative of a distance to the single-phase-to-ground fault location, $V_0^S$ is a zero sequence voltage component at a sending end of the three-phase series-compensated power line system, $V_2^S$ is a negative sequence voltage component at the sending end of the three-phase series-compensated power line system, $I_0^S$ is a zero sequence current component at the sending end of the first series-compensated power transmission line, $I_2^S$ is a negative sequence current component at the sending end of the three-phase series-compensated power line system, $V_0^R$ is a zero sequence voltage component at a receiving end of the three-phase series-compensated power line system, $V_2^R$ is a negative sequence voltage component at the receiving end of the three-phase series-compensated power line system, $I_0^R$ is a zero sequence current component at the receiving end of the three-phase series-compensated power line system, $I_2^R$ is a negative sequence current component at the receiving end of the three-phase series-compensated power line system, $Z_{0L}$ is a zero sequence total impedance component of the three-phase series-compensated power line system, $Z_{2L}$ is a negative sequence total impedance component of the three-phase series-compensated power line system, $I_0^M$ is an estimated zero sequence current component propagating through the first, second, and third compensating capacitor systems, and $I_2^M$ is an estimated negative sequence current component propagating through the first, second, and third compensating capacitor systems.

13. The detector of claim 10, wherein the at least one processor is further configured to execute a second fault location procedure for identifying a location of a double-phase-to-ground fault in the three-phase series-compensated power line system, the double-phase-to-ground fault characterized in part by any two of the first series capacitor protection element, the second series capacitor protection element, and the third series capacitor protection element turning active.

14. The detector of claim 13, wherein executing the second fault location procedure comprises solving the following equation:

$$d2 = \frac{\sum_{i=0}^{2} V_i^S - m\sum_{i=0}^{2} I_i^S Z_{iL} + jX_{cap} I_A^M - \sum_{i=0}^{2} V_i^R + (1-m)\sum_{i=0}^{2} I_i^R Z_{iL}}{(1-m)\sum_{i=0}^{2} (I_i^S + I_i^R) Z_{iL}}$$

wherein d2 is indicative of a distance to the double-phase-to-ground fault; $V_i^S$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $V_i^R$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $I_i^S$ represents each of a zero sequence current component (i=0) at the sending end of the three-phase series-compensated power line system, a positive sequence current component (i=1) at the sending end of the three-phase series-compensated power line system, and a negative sequence current component (i=2) at the sending end of the three-phase series-compensated power line system; $I_i^R$ represents each of a zero sequence current component (i=0) at the receiving end of the three-phase series-compensated power line system, a positive sequence current component (i=1) at the receiving end of the three-phase series-compensated power line system, and a negative sequence current component (i=2) at the receiving end of the three-phase series-compensated power line system; $Z_{iL}$ represents each of a zero sequence total impedance component (i=0), a positive sequence total impedance component (i=1) of the three-phase series-compensated power line system, and a negative sequence total impedance component (i=2) of the three-phase series-compensated power line system, $I_0^M$ is an estimated zero sequence current component propagating through the first, second, and third compensating capacitor systems, $I_1M$ is an estimated positive sequence current component propagating through the first, second, and third compensating capacitor systems, and $I_2^M$ is an estimated negative sequence current component propagating through the first, second, and third compensating capacitor systems.

15. The detector of claim 14, wherein executing the second fault location procedure precludes calculating an impedance value of any of the first series capacitor protection element, the second series capacitor protection element, or the third series capacitor protection element; precludes monitoring a status of any of the first, second, or third series capacitor protection elements; and precludes measuring a voltage drop across any of the first, second, or third series capacitors.

16. A method comprising:
  executing a synchronous measurement procedure concurrently at a sending end and a receiving end of a three-phase series-compensated power transmission line system for obtaining a set of electrical current measurements and a set of voltage measurements;
  receiving in a line fault location detector, the set of electrical current measurements and the set of voltage measurements based on the synchronous measurement procedure; and
  using at least one processor in the line fault location detector to execute a first fault location procedure for identifying a location of a single-phase-to-ground fault in the three-phase series-compensated power line system, the first fault location procedure comprising:
    determining a zero sequence voltage drop based in part on a relationship between a first impedance presented by the first compensating capacitor system during the single-phase-to-ground fault, a second impedance presented by the second compensating capacitor system during the single-phase-to-ground fault, and a third impedance presented by the third compensating capacitor system during the single-phase-to-ground fault, wherein one of the first impedance, the second impedance, or the third impedance is an undetermined impedance that is attributable to a corresponding one of the first series capacitor protection element, the second series capacitor protection element, or the third series capacitor protection element turning active during the single-phase-to-ground fault;
    determining at least one of a positive sequence voltage drop or a negative sequence voltage drop based in part on the relationship between the first impedance, the second impedance, and the third impedance; and
    determining the location of the single-phase-to-ground fault at least in part, by using the zero sequence voltage drop and the at least one of the positive sequence voltage drop or the negative sequence voltage drop to eliminate determining of the undetermined impedance, wherein the location is indicated to an output interface.

17. The method of claim 16, wherein using the zero sequence voltage drop and the at least one of the positive sequence voltage drop or the negative sequence voltage drop for determining the location of the single-phase-to-ground fault comprises subtracting the zero sequence voltage drop from the positive sequence voltage drop and further comprises solving the following equation:

$$d1 = \frac{(V_1^S - V_0^S) - m(I_1^S Z_{1L} - I_0^S Z_{0L}) + jX_{cap}(I_1^M - I_0^M) - (V_1^R - V_0^R) + (1-m)(I_1^R Z_{1L} - I_0^R Z_{0L})}{(1-m)((I_1^S + I_1^R)Z_{1L} - (I_0^S + I_0^R)Z_{0L})}$$

wherein d1 is indicative of a distance to the single-phase-to-ground fault location, $V_0^S$ is a zero sequence voltage component at a sending end of the three-phase series-compensated power line system, $V_1^S$ is a positive sequence voltage component at the sending end of the three-phase series-compensated power line system, $I_0^S$ is a zero sequence current component at the sending end of the first series-compensated power transmission line, $I_1^S$ is a positive sequence current component at the sending end of the three-phase series-compensated power line system, $V_0^R$ is a zero sequence voltage component at a receiving end of the three-phase series-compensated power line system, $V_1^R$ is a positive sequence voltage component at the receiving end of the three-phase series-compensated power line system, $I_0^R$ is a zero sequence current component at the receiving end of the three-phase series-compensated power line system, $I_1^R$ is a positive sequence current component at the receiving end of the three-phase series-compensated power line system, $Z_{0L}$ is a zero sequence total impedance component of the three-phase series-compensated power line system, $Z_{1L}$ is a positive sequence total impedance component of the three-phase series-compensated power line system, $I_0^M$ is an estimated zero sequence current component propagating through the first, second, and third compensating capacitor systems, and $I_1^M$ is an estimated positive sequence current component propagating through the first, second, and third compensating capacitor systems.

18. The method of claim 16, wherein using the zero sequence voltage drop and the at least one of the positive sequence voltage drop or the negative sequence voltage drop for determining the location of the single-phase-to-ground fault comprises subtracting the zero sequence voltage drop from the negative sequence voltage drop and further comprises solving the following equation:

$$d1 = \frac{(V_2^S - V_0^S) - m(I_2^S Z_{2L} - I_0^S Z_{0L}) + jX_{cap}(I_2^M - I_0^M) - (V_2^R - V_0^R) + (1-m)(I_2^R Z_{2L} - I_0^R Z_{0L})}{(1-m)((I_2^S + I_2^R)Z_{2L} - (I_0^S + I_0^R)Z_{0L})}$$

wherein d1 is indicative of a distance to the single-phase-to-ground fault location, $V_0^S$ is a zero sequence voltage component at a sending end of the three-phase series-compensated power line system, $V_2^S$ is a negative sequence voltage component at the sending end of the three-phase series-compensated power line system, $I_0^S$ is a zero sequence current component at the sending end of the first series-compensated power transmission line, $I_2^S$ is a negative sequence current component at the sending end of the three-phase series-compensated power line system, $V_0^R$ is a zero sequence voltage component at a receiving end of the three-phase series-compensated power line system, $V_2^R$ is a negative sequence voltage component at the receiving end of the three-phase series-compensated power line system, $I_0^R$ is a zero sequence current component at the receiving end of the three-phase series-compensated power line system, $I_2^R$ is a negative sequence current component at the receiving end of the three-phase series-compensated power line system, $Z_{0L}$ is a zero sequence total impedance component of the three-phase series-compensated power line system, $Z_{2L}$ is a negative sequence total impedance component of the three-phase series-compensated power line system, $I_0^M$ is an estimated zero sequence current component propagating through the first, second, and third compensating capacitor systems, and $I_2^M$ is an estimated negative sequence current component propagating through the first, second, and third compensating capacitor systems.

19. The method of claim 16, wherein the at least one processor is further configured to execute a second fault location procedure for identifying a location of a double-phase-to-ground fault in the three-phase series-compensated power line system, the double-phase-to-ground fault characterized in part by any two of the first series capacitor protection element, the second series capacitor protection element, and the third series capacitor protection element turning active.

20. The method of claim 19, wherein executing the second fault location procedure comprises solving the following equation:

$$d2 = \frac{\sum_{i=0}^{2} V_i^S - m \sum_{i=0}^{2} I_i^S Z_{iL} + jX_{cap}I_A^M - \sum_{i=0}^{2} V_i^R + (1-m)\sum_{i=0}^{2} I_i^R Z_{iL}}{(1-m)\sum_{i=0}^{2} (I_i^S + I_i^R)Z_{iL}}$$

wherein d2 is indicative of a distance to the double-phase-to-ground fault; $V_i^S$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $V_i^R$ represents each of a zero sequence voltage component (i=0) at the sending end of the three-phase series-compensated power line system, a positive sequence voltage component (i=1) at the sending end of the three-phase series-compensated power line system, and a negative sequence voltage component (i=2) at the sending end of the three-phase series-compensated power line system; $I_i^S$ represents each of a zero sequence current component (i=0) at the sending end of the three-phase series-compensated power line system, a positive sequence current component (i=1) at the sending end of the three-phase series-compensated power line system, and a negative sequence current component (i=2) at the sending end of the three-phase series-compensated power line system; $I_i^R$ represents each of a zero sequence current component (i=0) at the receiving end of the three-phase series-compensated power line system, a positive sequence current component (i=1) at the receiving end of the three-phase series-compensated power line system, and a negative sequence current component (i=2) at the receiving end of the three-phase series-compensated power line system; $Z_{iL}$ represents each of a zero sequence total impedance component (i=0), a positive sequence total impedance component (i=1) of the three-phase series-compensated power line system, and a negative sequence total impedance component (i=2) of the three-phase series-compensated power line system, $I_0^M$ is an estimated zero sequence current component propagating through the first, second, and third compensating capacitor systems, $I_1^M$ is an estimated positive sequence current component propagating through the first, second, and third compensating capacitor systems, and $I_2^M$ is an estimated negative sequence current component propagating through the first, second, and third compensating capacitor systems.

\* \* \* \* \*